United States Patent [19]

Corley

[11] Patent Number: 4,873,309

[45] Date of Patent: Oct. 10, 1989

[54] STABILIZED FLAME-RETARDANT EPOXY RESIN COMPOSITION FROM A BROMINATED EPOXY RESIN AND A VINYL MONOMER DILUENT

[75] Inventor: Larry S. Corley, Houston, Tex.

[73] Assignee: Shell Oil Company, Houston, Tex.

[21] Appl. No.: 59,434

[22] Filed: Jun. 8, 1987

[51] Int. Cl.$^4$ ............................................. C08G 59/14
[52] U.S. Cl. ................................... 528/102; 525/527; 525/529; 525/530; 526/209
[58] Field of Search ................. 528/102; 525/527, 529, 525/530

[56] References Cited

U.S. PATENT DOCUMENTS

| | | | |
|---|---|---|---|
| 3,321,438 | 5/1967 | Brooker et al. | 528/118 |
| 3,882,064 | 5/1975 | Pregmon | 523/428 |
| 4,009,223 | 2/1977 | Noonan | 525/524 |
| 4,040,993 | 8/1977 | Elbling et al. | 523/427 |
| 4,075,260 | 2/1978 | Toen et al. | 525/427 |
| 4,251,426 | 2/1981 | McClure et al. | 523/429 |
| 4,252,593 | 2/1981 | Green | 156/231 |
| 4,387,011 | 6/1983 | Makunchi et al. | 528/102 |
| 4,544,731 | 10/1985 | Cavitt et al. | 528/102 |
| 4,544,732 | 10/1985 | Corley | 528/90 |
| 4,554,342 | 11/1985 | Corley | 528/90 |
| 4,579,931 | 4/1986 | Corley | 528/90 |
| 4,601,973 | 7/1986 | Bauer | 430/280 |
| 4,654,383 | 3/1987 | Corley | 523/462 |
| 4,666,954 | 5/1987 | Forgo et al. | 522/83 |

*Primary Examiner*—John Kight
*Assistant Examiner*—Frederick Krass

[57] ABSTRACT

A composition is provided comprising the reaction product of a brominated phenhol and epichlorohydrin having a bromine content of at least about 30 percent and a weight per epoxide within the range of about 450 to about 800, an optional non-brominated epoxy resin, a curing agent for the epoxy resins, and a reactive diluent. The use of the defined brominated epoxy resin enables the preparation of a flame-retardant epoxy laminating system which has improved stability against crystallization with storage.

15 Claims, No Drawings

STABILIZED FLAME-RETARDANT EPOXY RESIN COMPOSITION FROM A BROMINATED EPOXY RESIN AND A VINYL MONOMER DILUENT

BACKGROUND OF THE INVENTION

This invention relates to epoxy resin compositions. In a specific embodiment, the invention relates to flame-retardant, monomer-diluted epoxy resin laminating compositions.

For use in applications such as electrical laminating, it is necessary to impart flame retardance to epoxy resins. Present techniques for imparting flame retardance to epoxy resins generally have one or more disadvantages. One method involves preparation of an epoxy resin by fusing a preformed liquid epoxy resin with tetrabromobisphenol-A. This technique, however, produces a resin which is solid at room temperature and must be diluted with large quantities of an organic solvent in order to reduce its viscosity to a level sufficient for impregnation of reinforcing fibers. The necessity for removal of this solvent causes a number of processing difficulties in the manufacture of fiber-reinforced composites for printed circuit boards. In compositions in which at least a portion of the organic solvent is replaced with a reactive diluent, there is a limit on the amount of the diluent which can be added without sacrificing laminating properties, since the diluent is not removed during the laminate preparation process.

The amount of solvent required to achieve acceptable viscosity can be reduced and the glass transition temperature of the cured laminate increased by reducing the molecular weight of the fusion resin product. However, this results in a lower bromine content in the resin. Commercial flame-retardant epoxy resins prepared by the fusion reaction of nonbrominated epoxy resins with tetrabromobisphenol-A generally have a molecular weight of 800 to 1000 and a bromine content of 18-21%. This bromine content is sufficient to provide flame retardance to standard commercial electrical laminates, which are cured with dicyandiamide, a curing agent used at a very low ratio (less than 5% by weight) of curing agent to epoxy resin.

When these resins are cured with curing agents, such as cycloaliphatic anhydrides, which are commonly used at higher ratios of curing agent to resin, however, the cured composition does not contain enough bromine to provide flame retardance unless the curing agent is also brominated. Also, the need for solvent removal could be avoided by using, as solvents for the resin, monomers such as styrene or acrylics, which polymerize during cure of the resin. However, the use of substantial amounts of the monomers for viscosity reduction would likewise lower the bromine content in the cured laminate to levels too low to provide the desired flame retardance.

Increasing the bromine content of the epoxy resin without increasing the molecular weight would thus appear to provide flame-retardance, retain the freedom to use non-brominated curing agents and diluent monomers, and minimize the volume of solvent or monomer necessary to provide low viscosity.

One way to prepare such epoxy resins with higher bromine content would be the direct glycidation of tetrabromobisphenol-A with epichlorohydrin, producing a low molecular weight epoxy resin not containing any units derived from non-brominated bisphenols, as would be the case with a fusion product. Such low molecular weight epoxy resins consisting primarily of the diglycidyl ether of tetrabromobisphenol-A are available as amorphous solids containing about 45% bromine. They are easily dissolved in styrene or other monomers to provide low-viscosity solutions of high bromine content. These solutions can be cured with various types of epoxy curing agents, including aromatic amines, to give flame-retardant cured epoxy resins of high glass transition temperature.

It has been found, however, that monomer solutions containing large fractions of the diglycidyl ether of tetrabromobisphenol-A can be subject to crystallization with storage. Redissolving the material requires heat and agitation, an inconvenience for users. Heating solutions containing reactive monomers to dissolve crystals may also cause polymerization and gelation of the solutions.

It is therefore an object of the invention to provide a monomer-diluted, flame-retardant, low molecular weight epoxy composition which has improved storage stability.

SUMMARY OF THE INVENTION

According to the invention, a composition is provided comprising (a) from about 0 to about 60 weight percent, based on the weight of components (a) and (b), of a first epoxy resin; (b) a second epoxy resin which is the reaction product of a brominated bisphenol with epichlorohydrin having a weight per epoxide within the range of about 450 to about 800, present in the composition in an amount of about 10 to about 90 weight percent, based on the weight of the composition; (c) an effective amount of a curing agent for the first and second epoxy resins; and (d) a reactive monomer. The composition optionally contains a free radical initiator and a curing accelerator. The composition is particularly suited for preparing reinforced composites such as printed circuit boards by continuous laminating techniques.

DETAILED DESCRIPTION OF THE INVENTION

The invention composition contains a brominated epoxy resin. The brominated epoxy resin is a reaction product of a brominated polyhydric phenol with epichlorohydrin having an average weight per epoxide (WPE) within the range of about 450 to about 800, preferably from about 450 to about 650. Preferably, the brominated epoxy resin will have a bromine content within the range of about 30 to abouut 70 percent, most preferably about 40 to about 60 percent. The brominated epoxy resin will generally be employed in such a manner as to provide a cured composition having a flame retardance rating of at least V-1, preferably V-0. The brominated phenol is preferably tetrabromobisphenol-A because of the high degree of flame retardance imparted by the resulting brominated epoxy resin. The brominated epoxy resin is present in the composition in an amount within the range of about 10 to about 90 weight percent, preferably about 30 to about 60 weight percent, based on the weight of the composition. A suitable brominated epoxy is available commercially as M&T Thermoguard* 210, a reaction product of tetrabromobisphenol-A and epichlorohydrin having a WPE of about 500-600.

The invention composition optionally contains a non-brominated epoxy resin. The non-brominated epoxy resin component of the invention composition can be any curable epoxy resin having, on the average, more than one vicinal epoxide group per molecule. The epoxy resin can be saturated or unsaturated, aliphatic, cycloaliphatic, aromatic or heterocyclic, and may bear substituents which do not materially interfere with the curing reaction. They may be monomeric or polymeric.

Suitable epoxy resins include glycidyl ethers prepared by the reaction of epichlorohydrin with a compound containing at least one hydroxyl group carried out under alkaline reaction conditions. The epoxy resin products obtained when the hydroxyl group-containing compound is bisphenol-A are represented below

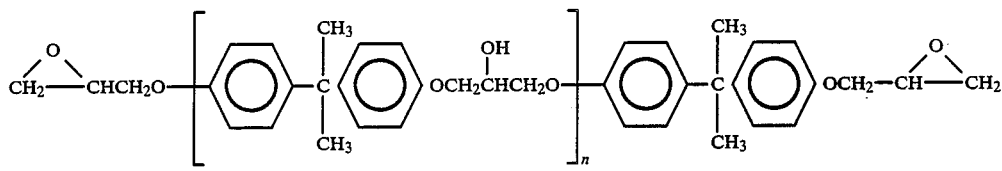

wherein n is zero or a number greater than 0, commonly in the range of 0 to 10, preferably in the range of 0 to 2. Other suitable epoxy resins can be prepared by the reaction of epichlorohydrin with mononuclear di- and trihydroxy phenolic compounds such as resorcinol and phloroglucinol, selected polynuclear polyhydroxy phenolic compounds such as bis(p-hydroxyphenyl)methane and 4,4'-dihydroxybiphenyl, or aliphatic polyols such as 1,4-butanediol and glycerol.

Epoxy resins suitable for the invention compositions have molecular weights generally within the range of 100 to about 10,000, preferably about 200 to about 1500. The commercially available liquid epoxy resin EPON ® Resin 828, a reaction product of epichlorohydrin and 2,2-bis(4-hydroxyphenyl)propane (bisphenol-A) having a molecular weight of about 400, an epoxide equivalent (ASTM D-1652) of about 185-192, and an n value in the formula above of about 0.2, is presently the preferred epoxy resin because of its low viscosity and commercial availability. The non-brominated epoxy resin will generally be present in the composition in an amount of from about 0 to about 60 weight percent, preferably about 20 to about 50 weight percent, based on the weight of the epoxy resin components of the composition.

The invention composition will contain a curing agent for the epoxy resin constituents of the composition. The curing agent selected is not critical and will depend upon the other constituents present and the curing properties desired for the composition. Curing agents for epoxy resins include aliphatic amines such as 1,2-diaminocyclohexane, aromatic amines such as 2,4-bis(p-aminobenzyl)aniline, cyclic anhydrides such as trimellitic anhydride, imidazoles such as 2-ethyl-4-methylimidazole, and cationic curing agents such as boron trifluoride complexes. The preferred curing agents for laminating applications are aromatic amines, imidazoles and cyclic anhydrides.

The curing agent will be present in the composition in an amount effective for curing the curable constituents of the composition. Generally, the curing agent will be present in an amount of from about 0.5 to about 2.0 chemical equivalents of amine (if the curing agent is an amine) to epoxy resin, preferably from about 0.75 to about 1.25 equivalents for each equivalent of epoxy resin, although this amount can vary depending upon the curing agent and the conditions of cure.

The invention composition further contains a reactive diluent. The reactive diluent is generally an aliphatic or aromatic monomer having at least one site of vinyl unsaturation. Examples of unsaturated aromatic monomers include, for example, styrene, α-methyl styrene, p-methyl styrene, halo- and nitro-substituted styrenes such as vinyl toluene, chlorostyrene, bromostyrene, nitrostyrene, divinylbenzene, tert-butylstyrene, 2-vinylpyridine, and vinynaphthalene. Styrene is the preferred vinyl aromatic monomer.

The reactive diluent can be an ester or amide of an ethylenically unsaturated carboxylic acid such as acrylic acid, methacrylic acid, crotonic acid, α-phenylacrylic acid, α-cyclohexylacrylic acid, maleic acid, cyanoacrylic acid and methoxyacrylic acid. Examples of esters of these include methyl methacrylate, ethyl acrylate, butyl acrylate, butyl methacrylate, isobutyl methacrylate, 2,3-dibromopropyl acrylate and pentachlorophenyl methacrylate.

Also included in the reactive diluents are polyacrylate and polymethacrylate esters of polyols containing more than one terminal acrylate or methacrylate group, such as acrylates and methacrylates of alkylene glycols, polyoxyalkylene glycols, alicyclic glycols, and higher glycols, such as, for example, ethylene glycol, triethylene glycol, tetraethylene glycol, tetramethylene glycol, hexanediol, trimethylolethane, trimethylolpropane and pentaerythritol. Typical such unsaturated monomers include trimethylolpropane triacrylate, trimethylolethane triacrylate, trimethylolpropane trimethacrylate, trimethylolethane trimethacrylate, tetramethylene glycol dimethacrylate, ethylene glycol dimethacrylate, triethylene glycol dimethacrylate and 1,6-hexanediol diacrylate. Preferred esters are neopentyl glycol dimethacrylate, trimethylolpropane trimethyacrylate, trimethylolpropane triacrylate, pentaerythritol triacrylate and 1,3-butylene dimethacrylate.

Examples of unsaturated carboxylic acid amides include acrylamide, N,N'-dimethylacrylamide, diacetone acrylamide, N-isopropylacrylamide and N,N'-dimethyl methacrylamide.

The reactive diluent can be a cyano-containing compound such as acrylonitrile, methacrylonitrile and halogenated acrylonitriles.

The reactive diluent can be a vinyl ester or amide such as vinyl acetate, vinyl benzoate, divinyl adipate, N-vinylpyrrolidone, N-vinylacetamide and N,N-divinyladipamide.

The reactive diluent can be an allyl-containing monomer such as diallyl phthalate, triallyl isocyanurate, diallyl isophthalate and allyl diglycol carbonate.

The reactive diluent can also be a mixture of one or more of the above monomers. A mixture of a vinyl aromatic monomer such as styrene, and a multifunctional methacrylate, such as trimethylolpropane trimethacrylate (TMPTMA), is preferred.

The reactive diluent will generally be present in the composition in an amount effective to reduce the viscosity of the composition to the desired level. Generally, the reactive diluent will be present in an amount of about 1 to about 75 weight percent, preferably about 3 to about 25 weight percent, based on the weight of the composition.

The invention composition optionally includes a free radical initiator present in an amount effective to crosslink the reactive diluent. Examples of such catalysts include the peroxides such as benzoyl peroxide, tert-butyl hydroperoxide, ditert-butyl peroxide, hydrogen peroxide, potassium persulfate, methyl cyclohexyl peroxide, cumene hydroperoxide, acetyl benzoyl peroxide and dicumyl peroxide; azo compounds such as 2,2'-azobisisobutyronitrile, dimethyl 2,2'-azobisisobutyrate, 2,2'-azobis(2,4-dimethylvaleronitrile) and 2,2'azobisisobutyramide. A preferred catalyst is 2,5-dimethyl-2,5-bis(tertiarybutylperoxy)hexane. The amount of the free radical initiator can vary over a wide range depending upon the type and amount of vinyl monomer present, the type of initiator and desired end properties. In general terms, the amount of the free radical initiator will, for most purposes, fall within the range of about 0.001 to about 10 weight percent, preferably about 0.01 to about 5 weight percent, based on the weight of the composition.

The invention composition optionally includes a curing accelerator present in an amount effective to increase the rate of cure of the epoxy resins. Suitable curing accelerators include carboxylic acids such as acetic acid, benzoic acid and salicylic acid; phenolic compounds such as phenol, p-nitrophenol, 2,4-dinitrophenol, 2,4-dichlorophenol, bisphenol-A, o-cresol, resorcinol and oligomeric condensates of phenolic compounds with aldehydes or ketones; imidazoles such as imidazole, 2-methylimidazole, 2-ethyl-4-methylimidazole and 1-benzyl-2-methylimidazole; borate esters such as trimethyl borate, tricresyl borate, and trimethoxyboroxine; metal complexes and salts such as stannous octoate, aluminum triisopropoxide, zinc acetylacetonate and di(sec-butoxy) aluminum ethyl acetoacetate complex; strong acids such as sulfuric and p-toluenesulfonic acid; sulfonium salts of anions of low nucleophilicity such as tetrafluoroborate; and boron trifluoride complexes. Imidazoles such as 2-methylimidazole are preferred for accelerating cyclic anhydride cure, while sulfonium salts are preferred for accelerating aromatic amine cure. The amount of accelerator present can vary widely but will generally be within the range of about 0.001 to about 10 weight percent, preferably about 0.01 to about 5 weight percent, based on the weight of the composition.

The monomers will usually contain an amount of a polymerization inhibitor effective to prevent premature polymerization of the monomer, generally less than about 0.5 weight percent, usually less than about 0.2 weight percent, based on the weight of the monomer.

Examples of suitable inhibitors include tertiary butyl catechol, benzoquinone, hydroquinone and phenothiazine.

The invention compositions are useful as sheet molding compositions, in structural applications such as automobile parts, coatings and electrical laminates. The composition is suitable for fiber-reinforced composites applications, for which a fibrous reinforcing material, such as chopped glass, glass fibers, carbon fiber, and the like, in the form of a mat, cloth or continuous fibers, for example, is impregnated with the epoxy resin system. The impregnated fibers are usually subjected to a relatively mild heat treatment ("B-staged") to partially cure the resin to a flexible, tacky state, or "prepreg." The prepreg is then subjected to elevated temperature and pressure so as to completely cure the resin to a hard, inflexible state. A plurality of prepregs can be layered and cured to form a laminate having utility in circuit boards. For such electrical applications, the properties of flame retardance and high Tg are important.

EXAMPLE 1

This example shows the superiority in crystallization resistance of a tetrabromobisphenol-A/epichlorohydrin reaction product with a WPE of 500–600 (M&T Thermoguard® 210) over tetrabromobisphenol-A/epichlorohydrin reaction products with WPE's of 325 (Dow DER® 542) and 340 (M&T Thermoguard® 220) when used in solutions with styrene, and optionally an acrylic monomer and EPON® Resin 828.

The components shown in Table 1 were mixed in glass vials or jars which were then placed on a tumbler until all solid components were dissolved and the solutions were homogeneous. (Some of the larger-scale mixtures were prepared in a planetary mixer instead.)

One can see from Table 1 that the monomer-diluted mixtures which contained substantial amounts of DER 542 or Thermoguard 220, tetrabromobisphenol-A/epichlorohydrin reaction products consisting largely of the diglycidyl ether of tetrabromobisphenol A, all deposited crystals after two months of standing at room temperature. If these low molecular weight brominated resins were used as the sole bromine source, avoiding crystallization required use of amounts of the brominated resins which were so low as to give only a few percent bromine in the system. This was too little bromine to impart significant flame retardance (compare also Example 2 below). By contrast, Thermoguard 210, a higer molecular weight reaction product of tetrabromobisphenol A and epichlorohydrin, gave monomer-diluted resin mixtures which did not deposit crystals after this time. When one of the mixtures was seeded with a crystal of the pure diglycidyl ether of tetrabromobisphenol-A, the crystal dissolved instead of seeding further crystallization. This apparently indicated that the lack of crystal deposition from the mixture was for thermodynamic rather than kinetic reasons and that the mixture was truly stable against crystallization.

TABLE I

Crystallization Resistance and Viscosity of Solutions of Brominated Epoxy$^a$

| | | | | | | | |
|---|---|---|---|---|---|---|---|
| Thermoguard 220, parts (WPE 340) | 50 | | 50 | | 37.5 | | 25 | 12.5 |
| Dow DER 542, parts (lot TB84071301, WPE 325) | | 50 | | 50 | | 37.5 | | |
| Epon Resin 828, parts | 50 | 50 | 50 | 50 | 62.5 | 62.5 | 75 | 87.5 |

TABLE I-continued

Crystallization Resistance and Viscosity of Solutions of Brominated Epoxy[a]

| | | | | | | | | |
|---|---|---|---|---|---|---|---|---|
| Styrene, parts | 15 | 15 | 21 | 21 | 15 | 15 | 15 | 15 |
| Ubbelohde kinematic viscosiy, 25° C., mm$^2$/sec- | 1069 | | 218 | 203 | | 442 | | |
| Time after mixing (days)-crystallization status[c] | 60-H | 1-VH | 1-VH | 60-H | 60-M | 60-H | 60-S | 60-N |
| Thermoguard 210, parts | 100[d] | 100[e] | 100[d] | 100[d] | 100[d] | 50[e] | 100[d] | |
| Epon Resin 828, parts | | | | | | 50 | | |
| Styrene, parts | 25 | 30 | 36.4 | 50 | | 20 | 25 | |
| TMPTMA, parts | | | | | 100 | 12 | 24 | |
| Lupersol 101, parts[g] | | | | | | 0.4 | 0.4 | |
| Ubbelohde kinematic viscosiy, 25° C., mm$^2$/sec- | 3365 | 766 | 446 | 95 | | | | |
| Time after mixing (days)-crystallization status[c] | 188-N | 365-N | 188-N | 188-GP | 188-GL | 240-N | 126-N | |

[a]Components were mixed at room temperature and then stirred in a planetary mixer or tumbled in a vessel on a tumbler until solid material had dissolved. In some cases, brominated resin was melted into EPON Resin 828 at elevated temperature and mixed until homogenous. Such mixtures were cooled to below 80° C. before monomers were added.
[b]ASTM D-445.
[c]By visual appearance. N = none; S = slight; M = moderate; H = heavy; VH = very heavy; GP = gel particles; GL = gel layer (at bottom)
[d]WPE 598.
[e]WPE 534.
[f]A crystal of the diglycidyl ether of tetrabromobisphenol A which was placed in this mixture dissolved instead of acting as a seed for further crystallization.
[g]Pennwalt Lucidol brand of 2,5-bis(t-butylperoxy)-2,5-dimethylhexane.

EXAMPLE 2

This example illustrates the preparation of flame retardant cured resin samples of high thermal resistance from monomer-diluted blends of Thermoguard 210 (and, for comparison, Thermoguard 220) with non-brominated epoxy resins such as EPON Resin 828.

A number of solutions were prepared by mixing Thermoguard 210, Thermoguard 220 and/or EPON Resin 828 with styrene, trimethylolpropane trimethacrylate (TMPTMA) and Lupersol 101 until homogeneous. Compositions are given in the footnotes of Tables 2-5. The resin solutions were combined with curing agents (some of which, particularly the aromatic amine curing agents, were themselves in the form of monomer solutions) in polypropylene beakers and mixed thoroughly with Jiffy mixers.

One portion of some of the mixtures was poured into a Ubbelohde viscometer which in turn was placed in a constant-temperature bath set at 25° C. Kinematic viscosity was determined periodically for each mixture. From the kinematic viscosity data was determined in each case a "pot life," or the amount of time required for the viscosity to double from its initial value.

Another portion of some of the mixtures was poured into a mold made of two glass plates held ⅛" (3.2 mm) apart with a polytetrafluoroethylene spacer to make a sheet casting. Still another portion of some of the mixtures was poured into two aluminum molds containing a linear cavity ½" (12.7 mm) square to form bar castings. The sheet and bar molds were paced in an oven and held for the respective cure cycles indicated in Tables 2-5. The sheet and bar castings were then removed from the molds and tested for mechanical and flammability properties. Mechanical and flammability properties are given in Tables 2-5.

From Tables 2-5, one can see that mixtures of Thermoguard 210, EPON ® Resin 828, styrenic and acrylic monomers, and curing agents can have highly desirable combinations of properties. These include low initial kinematic viscosity (<2 Pa.s), long pot life (>8 hours at 25° C.), relatively fast cure (<200 seconds to gel at 150° C.), high $T_g$ or HDT (>150° C.), adequate tensile elongation (>2% at room temperature) and acceptable flame resistance (ANSI UL94 V-0). These properties can be obtained with several different classes of curing agents, including aromatic amines (Tables 3 and 4), imidazoles (Table 5), and anhydrides (Table 6). Aliphatic amines (Table 6) delivered these properties except for pot life, while BF$_3$-ethylamine complex (Table 5) gave long gel times and produced castings which were low in elongation and $T_g$, although flammability was acceptable.

TABLE 2

Methylenedianiline Cure of Monomer-diluted Epoxy Resin Mixtures

| Composition as mixed: | | | |
|---|---|---|---|
| Thermoguard 220 mixture[a], g | 379.2 | 379.2 | |
| Thermoguard 210 mixture[b], | | | 264.8 |
| Methylenedianiline mixture[c], g | 90 | 90 | 51.4 |
| Sulfonium accelerator[d], g | | 3 | |
| Composition breakdown: | | | |
| Thermoguard 220, parts | 50 | 50 | |
| Thermoguard 210, parts | | | 50 |
| Epon Resin 828, parts | 50 | 50 | 50 |
| Total aromatic amines, parts | 22.1 | 22.1 | 18.9 |
| Sulfonium accelerator, parts | | 1 | |
| Styrene[e], parts | 18 | 18 | 20 |
| TMPTMA[e] parts | 15.9 | 15.9 | 18.8 |
| (trimethylolpropane | | | |

TABLE 2-continued

Methylenedianiline Cure of Monomer-diluted Epoxy Resin Mixtures

| | | | |
|---|---|---|---|
| trimethacrylate) | | | |
| Lupersol 101[1], parts | 0.4 | 0.4 | 0.4 |
| Processing properties: | | | |
| Hot plate gel time, seconds | | | |
| 180° C. | 255 | 17 | 360 |
| 150° C. | 685 | 36 | 860 |
| 120° C. | 2100 | 225 | 2400 |
| Elapsed time (minutes) - | 170–988 | 165–1075 | 155–1185 |
| Ubbelohde kinematic | 290–1000 | 285–1214 | 305–1216 |
| viscosity of resin/curing | 370–1011 | 365–1330 | 360–1256 |
| agent mixture (mm²/sec) | 455–1059 | 450–1581 | 445–1285 |
| (25° C.) (ASTM D-445) | | | 1465–2010 |
| | | | 1875–2558 |
| Pot life, hours | >20 | 9.5 | 28 |
| Mechanical properties[h]: | | | |
| HDT, 264 psi, °C. (ASTM D-648) | 179,180 | 165,170 | 170 |
| R.T. Tensile (ASTM D-638): | | | |
| Strength, MPa | 64 ± 23 | 70 ± 8 | |
| Modulus, Gpa | 2.99 ± 0.14 | 2.85 ± 0.11 | |
| Elongation, % | 3.7 ± 1.9 | 3.8 ± 0.8 | |
| Flammability properties[h]: | | | |
| % Bromine in cured casting | 15.7 | 15.6 | 15.5 |
| Total burn time, sec. (ANSI UL94) | 38 | 105 | 34.5 |
| Classification | V-1 | No rating | V-1 |

[a]Thermoguard 220 mixture was prepared by mixing 50 parts of Thermoguard 220 (WPE 340), 50 parts of Epon resin 828, 18 parts of styrene[e], 8 parts of TMPTMA[e], and 0.4 part of Lupersol 101[d] until homogeneous.
[b]Thermoguard 210 mixture was prepared by mixing 50 parts of Thermoguard 210 (WPE 534), 50 parts of Epon resin 828, 20 parts of styrene[j], 12 parts of TPTMA[e], and 0.4 part of Lupersol 101[f] until homogeneous.
[c]MDA (methylenedianiline) mixture contained 19 parts of Dow Curithane 116 (crude methylenedianiline), 9 parts of DuPont BABA (crude 2,4-bis(p-aminobenzyl)-aniline), and 10 parts of TMPTMA[e].
[d]Similar to product of Example 4 of U.S. Pat. No. 4,554,342.
[e]All monomers contained 1000 ppm phenothiazine as polymerization inhibitor.
[f]Pennwalt Lucidol brand of 2,5-bis(t-butylperoxy)-2,5-dimethylhexane.
[g]Time for initial Ubbelohde kinematic viscosity to double at 25° C.
[h]Cure cycle = 1 hour at 80° C. followed by 1 hour at 120° C., 1 hour at 150° C, and 2 hours at 175° C.

TABLE 3

Methylenedianiline Cure of Monomer-diluted Epoxy Resin Mixtures

| Composition as mixed: | | | | | | |
|---|---|---|---|---|---|---|
| Thermoguard 210 mixture[a], g | 149.4 | 224.2 | 298.8 | 149.4 | 224.2 | 298.8 |
| EPON ® Resin 828 mixture[b], g | 120.4 | 60.2 | | 120.4 | 60.2 | |
| Methylenedianiline mixture[c], g | 50 | 36.8 | 23.8 | 50 | 36.8 | 23.8 |
| Sulfonium accelerator[d], g | | | | 3 | 4.5 | 6 |
| Additional styrene[e], g | 3 | 4.5 | 6 | 3 | 4.5 | 6 |
| Additional TMPTMA[e], g | 1 | 1.5 | 2 | 1 | 1.5 | 2 |
| (trimethylolpropane trimethacrylate) | | | | | | |
| Composition breakdown: | | | | | | |
| Thermoguard 210, parts | 50 | 75 | 100 | 50 | 75 | 100 |
| Epon resin 828, parts | 50 | 25 | | 50 | 25 | |
| Total aromatic amines, parts | 18.4 | 13.6 | 8.8 | 18.4 | 13.6 | 8.8 |
| Sulfonium accelerator[d], parts | | | | 1 | 1 | 1 |
| Total styrene[e], parts | 21.5 | 24.8 | 28 | 21.5 | 24.8 | 28 |
| Total TMPTMA[e], parts | 21.6 | 23.6 | 27.1 | 21.6 | 23.6 | 27.1 |
| Total Lupersol 101[f], parts | 0.4 | 0.4 | 0.4 | 0.4 | 0.4 | 0.4 |
| Processing properties: | | | | | | |
| Hot plate gel time, seconds | | | | | | |
| 180° C. | | | | 610 | | 35 |
| 150° C. | | | | 1770 | | 110 |
| 120° C. | | | | | | 400 |
| Elapsed time (minutes)- | | | | 160–1064 | | 155–1031 |
| Ubbelohde kinematic | | | | 290–1093 | | 325–1079 |
| viscosity of resin/ | | | | 355–1112 | | 450–1115 |
| curing agent mixture | | | | 445–1136 | | 1580–1851 |
| (mm²/sec)(25° C.) | | | | 1415–1327 | | 1885–2302 |
| (ASTM D-445) | | | | 1900–1442 | | 3055–6868 |
| | | | | 3035–1772 | | |
| | | | | 4455–2382 | | |
| | | | | 5935–3345 | | |

TABLE 3-continued

Methylenedianiline Cure of Monomer-diluted Epoxy Resin Mixtures

| | | | | | | |
|---|---|---|---|---|---|---|
| Pot life, hours at 25° C.[g] | | | 65 | | | 27 |
| Mechanical Properties[h]: | | | | | | |
| HDT, 264 psi, °C. (ASTM D-648) | 162 | 168 | 167 | 167 | 164 | 157 |
| R.T. Tensile (ASTM D-638): | | | | | | |
| Strength, MPa | 49.3 ± 4.0 | 30.1 ± 7.4 | | 68.5 ± 2.5 | 45.7 ± 2.8 | 29.2 ± 4.7 |
| Modulus, GPa | 3.26 ± 0.06 | 3.31 ± 0.38 | | 3.28 ± 0.05 | 3.43 ± 0.04 | 3.54 ± 0.01 |
| Elongation, % | 1.88 ± 0.19 | 0.99 ± 0.27 | | 3.14 ± 0.22 | 1.56 ± 0.13 | 0.87 ± 0.10 |
| Flammability properties[h] | | | | | | |
| % Bromine in cured casting | 15.1 | 22.5 | 29.6 | 15.0 | 22.3 | 29.5 |
| Total burn time, sec. (ANSI UL94) | 25 | 8 | 10 | 64 | 10 | 8.5 |
| Classification | V-1 | V-0 | V-0 | V-1 | V-0 | V-0 |

[a]Thermoguard 210 mixture (13067-103) was prepared by mixing 100 parts of Thermoguard 210 (WPE 598), 25 parts of styrene[e], 24 parts of TMPTMA[e], and 0.4 part Lupersol 101[f] until homogeneous.
[b]Epon resin 828 mixture was prepared by mixing 100 parts of EPON resin 828, 15 parts of styrene[e] and 0.4 parts of Lupersol 101[f] until homogeneous.
[c]MDA (methylenedianiline) mixture contained 19 parts of Dow Curithane ® 116 (crude methylenedianiline), 9 parts of DuPont BABA (crude 2,4-bis(p-amino-benzyl)aniline), and 10 parts of TMPTMA[e].
[d]Similar to product of Example 4 of U.S. Pat. No. 4,554,342.
[e]All monomers contained 1000 ppm phenothiazine as polymerization inhibitor.
[f]Pennwalt Lucidol brand of 2,5-bis(t-butylperoxy)-2,5-dimethylhexane.
[g]Time for initial Ubbelohde kinematic viscosity to double at 25° C.
[h]Cure cycle = 1 hour at 80° C. followed by 1 hour at 120° C., 1 hour at 150° C. and 2 hours at 175° C.

TABLE 4

Diethyltoluenediamine (DETDA) Cure of Monomer-Diluted Epoxy Resin Mixtures

| | | | |
|---|---|---|---|
| Composition as mixed: | | | |
| Thermoguard 210 mixture[a], g | 149.4 | 224.2 | 298.8 |
| EPON ® Resin 828 mixture[b], g | 108.4 | 54.2 | |
| DETDA mixture[c], g | 39.4 | 29.2 | 18.8 |
| Composition breakdown: | | | |
| Thermoguard 210, parts | 50 | 75 | 100 |
| Epon Resin 828, parts | 50 | 25 | |
| DETDA, parts (diethyltoluenediamine) | 15.7 | 11.7 | 9.4 |
| Total styrene[d], parts | 16.5 | 20.8 | 25 |
| Total TMPTMA[d], parts (trimethylolpropane trimethacrylate) | 15.9 | 20.9 | 25.9 |
| Total Lupersol 101[e], parts | 0.4 | 0.4 | 0.4 |
| Processing properties: | | | |
| Hot plate gel time, seconds | | | |
| 180° C. | | | >8200 |
| 150° C. | | | >9000 |
| Elapsed time (minutes) | | | 135–1145 |
| Ubbelohde kinematic | | | 445–1199 |
| viscosity of resin/ | | | 1610–1285 |
| curing agent mixture | | | 5745–1651 |
| (mm²/sec)(25° C.) | | | 8645–1908 |
| (ASTMD-445) | | | |
| Pot life, hours at 25° C.[f] | | | 200 |
| Mechanical properties[g]: | | | |
| HDT, 264 psi, °C. (ASTM D-648) | 158 | 150 | 153 |
| R.T. Tensile (ASTM D-638): | | | |
| Strength, MPa | 33.7 ± 4.0 | 16.7 ± 6.4 | |
| Modulus, GPa | 3.12 ± 0.04 | 3.40 ± 0.10 | |
| Elongation, % | 1.22 ± 0.18 | 0.51 ± 0.11 | |
| Flammability properties[g]: | | | |
| % Bromine in cured casting | 16.5 | 23.5 | 30.9 |
| Total burn time, sec. (ANSI UL94) | 336 | 10 | 10 |
| Classification | No rating | V-0 | V-0 |

[a]Thermoguard 210 mixture was prepared by mixing 100 parts of Thermoguard 210 (WPE 598), 25 parts of styrene[d], 24 parts of TMPTMA[d], and 0.4 parts Lupersol 101[e] until homogeneous.
[b]Epon Resin 828 mixture was prepared by mixing 100 parts of Epon resin 828, 8 parts of styrene[d] and 0.4 part of Lupersol 101[e] until homogeneous.
[c]DETDA mixture was prepared by mixing 32 parts of DETDA (Ethyl Corp.) and 8 parts of TMPTMA[d] until homogeneous.
[d]All monomers contained 1000 ppm phenothiazine as polymerization inhibitor.
[e]Pennwalt Lucidol brand of 2,5-bis(t-butylperoxy)-2,5-dimethylhexane.
[f]Time for initial Ubbelohde kinematic viscosity to double at 25° C.
[g]Cure cycle = 1 hour at 80° C. followed by 1 hour at 120° C., 1 hour at 150° C., and 4 hours at 175° C.

TABLE 5
Cure by BF$_3$ Ethylamine Complex and Imidazoles of Monomer-diluted Epoxy Resin Mixtures

| Composition as mixed: | | | | | | |
|---|---|---|---|---|---|---|
| Thermoguard 210 mixture$^a$, g | 200 | 200 | 320 | 200 | 200 | 320 |
| EPON ® Resin 828 mixture$^b$, g | 200 | 100 | 64 | 200 | 100 | 64 |
| Imidazole mixture$^c$, g | 10 | 7 | 8.32 | | | |
| BF$_3$.C$_2$H$_5$NH$_2$ solution, g | | | | 16.6 | 11.6 | 13.76 |
| Composition breakdown: | | | | | | |
| Thermoguard 210, parts | 42 | 59.2 | 78.4 | 42 | 59.2 | 78.4 |
| Epon resin 828, parts | 58 | 40.8 | 21.6 | 58 | 40.8 | 21.6 |
| Imidazole mixture, parts | 3.14 | 3.10 | 3.05 | | | |
| BF$_3$.C$_2$H$_5$NH$_2$, parts | | | | 3.65 | 3.59 | 3.52 |
| Styrene, parts | 15.2 | 18.1 | 21.3 | 15.2 | 18.1 | 21.3 |
| TMPTMA$^e$, parts (trimethylolpropane trimethacrylate) | 10.1 | 14.2 | 18.8 | 10.1 | 14.2 | 18.8 |
| 1,4-butanediol, parts | | | | 1.56 | 1.54 | 1.51 |
| Lupersol 101$^f$, parts | 0.4 | 0.4 | 0.4 | 0.4 | 0.4 | 0.4 |
| Processing properties: | | | | | | |
| Hot plate gel time, seconds | | | | | | |
| 180° C. | 69 | | ~110 | ~70 | | ~135 |
| 150° C. | 180 | | 380 | 640 | | 850 |
| 120° C. | 510 | | 1200 | | >3500 | |
| Elapsed time (minutes)- Ubbelohde kinematic viscosity of resin/ curing agent mixture (mm$^2$/sec)(25° C.) (ASTM D-445) | 148–1361 298–1497 418–1583 ~1400-gel particles | | 150–1637 300–1758 420–1418 ~1400-gel particles | 103–1409 453–1418 1528–1483 1883–1501 2893–1562 4338–1615 | | 105–1666 455–1673 1530–1728 1885–1748 2895–1755 4340–1829 |
| Pot life, hours at 25° C.,$^g$ | >7 and <24 | | >7 and <24 | >>72 | | >>72 |
| Cure cycle | A | A | A | B | B | B |
| Mechanical properties: | | | | | | |
| T$_g$, Rheometrics, °C. (tan δ peak) | 189 | 188 | 190 | 140 | 142 | 127 |
| R.T. Tensile (ASTM D-638): | | | | | | |
| Strength, MPa | 59 ± 5 | 56 ± 6 | 50 ± 9 | 30 ± 6 | 20 ± 4 | 11 ± 2 |
| Modulus, GPa | 3.11 ± 0.11 | 3.15 ± 0.01 | 3.36 ± 0.09 | 3.40 ± 0.06 | 3.56 ± 0.03 | 3.78 ± 0.06 |
| Elongation, % | 2.8 ± 0.5 | 2.3 ± 0.4 | 1.8 ± 0.4 | 0.9 ± 0.2 | 0.6 ± 0.1 | 0.3 ± 0.1 |
| Flammability properties: | | | | | | |
| % Bromine in cured casting | 16.0 | 21.4 | 26.8 | 15.7 | 21.1 | 26.4 |
| Total burn time, sec. (ANSI UL94) | 10.5 | 10 | 11 | 21 | 16 | 11 |
| Classification | V-0 | V-0 | V-0 | V-1 | V-0 | V-0 |

$^a$Thermoguard 210 mixture was prepared by mixing 100 parts of Thermoguard 210 (WPE 598), 25 parts of styrene$^e$, 24 parts of TMPTMA$^e$, and 0.4 part Lupersol 101$^f$ until homogeneous.
$^b$Epon resin 828 mixture was prepared by mixing 100 parts of EPON resin 828, 8 parts of styrene$^e$ and 0.4 part of Lupersol 101$^f$ until homogeneous.
$^c$Imidazole mixture contained 85 parts of 2-ethyl-4-methylimidazole and 15 parts of 2-methylimidazole.
$^d$BF$_3$.C$_2$H$_5$NH$_2$ solution (16701-8-2) was prepared by mixing 70 parts of BF$_3$.C$_2$H$_5$NH$_2$ and 30 parts of 1,4-butanediol at 70° C. until homogeneous.
$^e$All monomers contained 1000 ppm phenothiazine as polymerization inhibitor.
$^f$Pennwalt Lucidol brand of 2,5-bis(t-butylperoxy)-2,5-dimethylhexane.
$^g$Time for initial Ubbelohde kinematic viscosity to double at 25° C.
$^h$Cure cycle A = 2 hours at 80° C. followed by 1 hour at 120° C., 1 hour at 150° C. and 1 hour at 175° C.; cure cycle B = 2 hours at 80° C. followed by 2 hours at 150° C.

TABLE 6
Anhydride and Cycloaliphatic Amine Cure of Monomer-Diluted Epoxy Resin Mixtures

| Composition as mixed: | | | | | | |
|---|---|---|---|---|---|---|
| Thermoguard 210 mixture$^a$, g | 200 | 300 | 330 | 220 | 300 | 320 |
| EPON ® Resin 828 mixture$^b$, g | 80 | 60 | | 110 | 75 | 32 |
| ECA 100$^c$, g | 96 | 99 | 56.1 | | | |
| Imidazole mixture$^d$, g | 2.4 | 3.3 | 3.3 | | | |
| Millamine 5260$^e$, g | | | | 25.3 | 22.5 | 15.3 |
| Composition breakdown: | | | | | | |
| Thermoguard 210, parts | 64.5 | 78.4 | 100 | 59.2 | 74.4 | 87.9 |
| Epon resin 828, parts | 35.5 | 21.6 | | 40.8 | 25.6 | 12.1 |
| ECA 100, parts | 46.2 | 38.7 | 25.4 | | | |
| Imidazole mixture, parts | 1.2 | 1.3 | 1.5 | | | |
| Millamine 5260, parts | | | | 10.2 | 8.3 | 6.3 |
| Styrene$^f$, parts | 19.0 | 21.9 | 25.0 | 18.1 | 20.6 | 22.9 |
| TMPTMA$^f$, parts | 15.5 | 18.8 | 24.0 | 14.2 | 17.8 | 21.1 |

TABLE 6-continued

Anhydride and Cycloaliphatic Amine Cure of Monomer-Diluted Epoxy Resin Mixtures

| | | | | | | |
|---|---|---|---|---|---|---|
| (trimethylolpropane trimethacrylate) | | | | | | |
| Lupersol 101$^g$, parts | 0.4 | 0.4 | 0.4 | 0.4 | 0.4 | 0.4 |
| Processing properties: | | | | | | |
| Hot plate gel time, seconds | | | | | | |
| 180° C. | ~42 | | ~75 | 31 | | 29 |
| 150° C. | 155 | | 280 | 160 | | 170 |
| 120° C. | 650 | | ~950 | | | |
| Elapsed time (minutes)- | 128–1301 | | 130–3690 | 64–709 | | 66–1417 |
| Ubbelohde kinematic | 218–1502 | | 220–4542 | 94–872 | | 96–1599 |
| viscosity of resin/ | 323–1766 | | 325–5535 | 119–1009 | | 121–1784 |
| curing agent mixture | 383–1910 | | 395–6073 | 139–1179 | | 141–1954 |
| (mm$^2$/sec)(25° C.) | 1405–5221 | | | 169–1351 | | 171–2109 |
| (ASTM D-445) | | | | | | |
| Pot life, hours | | | | | | |
| at 25° C.,$^h$ | 8.0 | | 5.5 | 1.7 | | 3.3 |
| Mechanical properties:$^i$ | | | | | | |
| Tg, Rheometrics, °C. | | | | | | |
| (tan δ peak) | 159 | 140 | 170 | 140 | 168 | 160 |
| R.T. Tensile (ASTM D-638): | | | | | | |
| Strength, MPa | 70 ± 14 | 60 ± 13 | 62 ± 6 | 53 ± 11 | 63 ± 5 | 55 ± 7 |
| Modulus, GPa | 3.47 ± 0.04 | 3.53 ± 0.08 | 3.62 ± 0.06 | 3.39 ± 0.19 | 3.37 ± 0.08 | 3.61 ± 0.20 |
| Elongation, % | 2.8 ± 1.1 | 2.0 ± 0.6 | 2.0 ± 0.3 | 1.9 ± 0.5 | 2.3 ± 0.3 | 1.8 ± 0.3 |
| Flammability properties$^i$ | | | | | | |
| % Bromine in cured casting | 17.3 | 21.3 | 27.8 | 20.3 | 24.8 | 28.6 |
| Total burn time, sec. | | | | | | |
| (ANSI UL94) | 10 | 21 | 10 | 12 | 10 | 10 |
| Classification | V-0 | V-0 | V-0 | V-0 | V-0 | V-0 |

$^a$Thermoguard 210 mixture was prepared by mixing 100 parts of Thermoguard 210 (WPE 598), 25 parts of styrene$^f$, 24 parts of TMPTMA$^f$, and 0.4 part Lupersol 101$^g$ until homogeneous.
$^b$Epon resin 828 mixture was prepared by mixing 100 parts of EPON resin 828, 8 parts of styrene$^f$ and 0.4 part of Lupersol 101$^g$ until homogeneous.
$^c$Archem brand of methyl tetrahydrophthalic anhydride.
$^d$Imidazole mixture contained 85 parts of 2-ethyl-4-methylimidazole and 15 parts of 2-methylimidazole.
$^e$Milliken brand of 1,2-diaminocyclohexane.
$^f$All monomers contained 1000 ppm phenothiazine as polymerization inhibitor.
$^g$Pennwalt Lucidol brand of 2,5-bis(t-butylperoxy)-2,5-dimethylhexane.
$^h$Time for initial Ubbelohde kinematic viscosity to double at 25° C.
$^i$Cure cycle = 2 hours at 80° C. followed by 2 hours at 150° C.

I claim:

1. A composition comprising:
   (a) a brominated epoxy resin which is the reaction product of a brominated polyhydric phenol and epichlorohydrin, said brominated epoxy resin having a weight per epoxide within the range of about 450 to about 800 and a bromine content of from about 30 to about 70 percent;
   (b) an effective amount of a curing agent for the brominated epoxy resin; and
   (c) from about 5 to 50 weight percent, based on the weight of the composition, of at least one reactive diluent selected from the group consisting essentially of aliphatic and aromatic monomers having at least one site of vinyl unsaturation.

2. The composition of claim 1 which further comprises (d) a second epoxy resin, which second epoxy resin is a non-brominated diglycidyl ether of a polyhydric phenol.

3. The composition of claim 1 in which the curing agent comprises an aromatic amine.

4. The composition of claim 1 in which the reactive diluent is selected from vinyl aromatic monomers, esters of ethylenically unsaturated carboxylic acids, amides of ethylenically unsaturated carboxylic acids, polyacrylate esters of polyols, polymethacrylate esters of polyols, cyano-containing compounds, vinyl esters, vinyl amides and allyl-containing compounds.

5. The composition of claim 1 in which the brominated epoxy resin has a weight per epoxide within the range of about 450 to about 650.

6. The composition of claim 5 in which the brominated epoxy resin is present in an amount of from about 30 to about 60 weight percent.

7. The composition of claim 1 in which the brominated epoxy resin has a bromine content of from about 40 to about 60 percent.

8. The composition of claim 1 in which the curing agent comprises methylenedianiline.

9. The composition of claim 1 in which the reactive diluent comprises styrene.

10. The composition of claim 1 in which the reactive diluent comprises trimethylolpropane trimethacrylate.

11. The composition of claim 1 further comprising an effective amount of a cure accelerator.

12. The composition of claim 11 in which the cure accelerator is selected from imidazoles and sulfonium salts.

13. The composition of claim 11 in which the cure accelerator is 2-methylimidazole.

14. A prepreg comprising the composition of claim 1.

15. An electrical laminate comprising the composition of claim 1.

* * * * *